(12) United States Patent
Keevers et al.

(10) Patent No.: US 8,039,051 B2
(45) Date of Patent: Oct. 18, 2011

(54) METHOD AND APPARATUS FOR HYDROGENATION OF THIN FILM SILICON ON GLASS

(75) Inventors: Mark John Keevers, New South Wales (AU); Adrian Bruce Turner, Thalheim (DE)

(73) Assignee: CSG Solar AG (DE)

( * ) Notice: Subject to any disclaimer, the term of this patent is extended or adjusted under 35 U.S.C. 154(b) by 753 days.

(21) Appl. No.: 11/915,918

(22) PCT Filed: Jun. 2, 2006

(86) PCT No.: PCT/AU2006/000752
§ 371 (c)(1),
(2), (4) Date: Jan. 4, 2008

(87) PCT Pub. No.: WO2006/128247
PCT Pub. Date: Dec. 7, 2006

(65) Prior Publication Data
US 2008/0199612 A1    Aug. 21, 2008

(30) Foreign Application Priority Data
Jun. 3, 2005 (AU) ............................... 2005902865

(51) Int. Cl.
*C23C 16/00* (2006.01)
*H05H 1/24* (2006.01)
(52) U.S. Cl. ................. 427/248.1; 427/569; 427/255.11
(58) Field of Classification Search ............... 427/248.1, 427/569, 255.11
See application file for complete search history.

(56) References Cited

U.S. PATENT DOCUMENTS

| 5,250,328 | A | 10/1993 | Otto | 427/535 |
| 6,670,543 | B2 | 12/2003 | Lohmeyer et al. | 136/258 |
| 2004/0060515 | A1* | 4/2004 | Tanabe et al. | 118/719 |

FOREIGN PATENT DOCUMENTS

| EP | 0 472 465 | 2/1992 |
| EP | 0472465 A2 * | 2/1992 |
| EP | 0 556 912 | 8/1993 |
| EP | 0 651 427 A1 | 5/1995 |

(Continued)

OTHER PUBLICATIONS

International Preliminary Report on Patentability in PCT/AU2006/000752 dated Dec. 6, 2007.
European Office Action dated Aug. 7, 2009.
International Search Report dated Sep. 9, 2008 in corresponding European Application No. 06 741 169.4.

(Continued)

*Primary Examiner* — Kelly M Gambetta
(74) *Attorney, Agent, or Firm* — Ostrolenk Faber LLP (57) ABSTRACT

A method and apparatus is provided for hydrogenation of a target, such as a polycrystalline silicon film on a glass substrate, by using an atomic hydrogen source. The target is subjected to intermittent exposure of the atomic hydrogen field of the source until at least one area of the target has been subjected to the hydrogen field for a predetermined minimum period of time. The processing area of the source established by its atomic hydrogen field is smaller than the target, and after the target is moved into the high temperature processing zone it is translated within the high temperature processing zone to intermittently process successive areas of the target until the entire target has been processed for a predetermined minimum period of time. After the entire target has been processed, the target is cooled to a predetermined lower temperature while still intermittently subjecting the target to atomic hydrogen.

9 Claims, 5 Drawing Sheets

FOREIGN PATENT DOCUMENTS

| | | |
|---|---|---|
| EP | 0 556 912 | 7/1998 |
| EP | 0 556 912 B1 * | 7/1998 |
| JP | 10-209150 | 8/1998 |
| JP | 2000-058836 | 2/2000 |
| JP | 2002-184995 | 6/2002 |
| WO | WO 97/04478 | 2/1997 |
| WO | WO 97/04479 * | 2/1997 |

OTHER PUBLICATIONS

R. A. Ditizio et al., Short time electron cyclotron resonance hydrogenation of polycrystalline silicon thin-film transistor structures, Appl. Phys. Lett. 56 (12), Mar. 19, 1990, pp. 1140-1142.

M. Yamaguchi et al., The effect of hydrogen plasma on the properties of a-Si: H/a-$Si_{i-x}N_x$: H superlattices, Philosophical Magazine Letters, 1988, vol. 58, No. 4, pp. 213-218.

James D. Bernstein, et al., Hydrogeneration of Polycrystalline Silicon Thin Film Transistors by Plasma Ion Implantation, IEEE: Electron Device Letters 16 Oct. 1995, No. 10, pp. 421-423.

Debajyoi Das, A novel approach towards silicon nanotechnology, J. Phys. D. Appl. Phys. 36 (2003) 2235-2346.

PCT International Search Report & Written Opinion dated Jul. 7, 2006 issued in corresponding PCT International Patent Appln. No. PCT/AU2006/000752 filed on Jun. 2, 2006.

* cited by examiner

METHOD AND APPARATUS FOR HYDROGENATION OF THIN FILM SILICON ON GLASS

CROSS REFERENCE TO RELATED APPLICATION

The present application is a 35 U.S.C. §§371 national phase conversion of PCT/AU2006/000752, filed 2 Jun. 2006, which claims priority of Australian Application No. 2005902865, filed 3 Jun. 2005. The PCT International Application was published in the English language.

INTRODUCTION

The present invention relates generally to the field of semiconductor device processing and in particular, the invention provides an improved method and apparatus for hydrogen passivation in semiconductor material.

BACKGROUND

Thin-film, crystalline silicon on glass (CSG) technology has attracted a great deal of interest as an active material in photovoltaic devices and other large area applications such as thin film transistors (TFT). When applied to solar cells, CSG technology can deliver very low manufacturing costs, however a key element in achieving useful efficiencies which result in a low $/W manufacturing cost is effective, low-cost hydrogenation for defect passivation.

In order to obtain technologically useful materials and devices, the deleterious electrical activity of defects must be reduced. Hydrogenation, the incorporation of atomic hydrogen, has been shown to be an effective method for passivating defects in semiconductors such as silicon. Numerous defects are susceptible to hydrogen passivation, including Si dangling bonds and strained Si—Si bonds at grain boundaries, dislocations, point defects with deep levels such as Au and Fe, and oxygen and its complexes. Commonly used hydrogenation methods include directed ion beam or Kaufman sources, and plasma sources in either the direct or remote configuration. It has long been known that H-induced damage can be of critical importance, motivating the use of remote plasma sources. In the PV industry, the most widely used hydrogenation technique uses a hydrogen-rich $SiN_x$ layer deposited by PECVD to simultaneously provide an antireflection coating, surface passivation and following H diffusion into the silicon during the contact firing step, bulk passivation. The efficiency of hydrogenation strongly depends on the passivation technique, passivation temperature, and the type and density of defects in the target material—with low-cost CSG presenting a significant challenge.

CSG modules are fabricated by depositing amorphous silicon onto textured glass after which the silicon is crystallised, for example by solid-phase crystallisation, or laser crystallisation. The resulting highly defected poly-Si is then improved by rapid thermal annealing and hydrogenation. Various methods of hydrogenation have been tried, however many existing methods are slow and the speed with which the hydrogenation step can be completed has a significant effect on the cost of production of a CSG module.

A problem with hydrogenation methods where the target must be immersed in a plasma is that regardless of the speed of the process itself loading the target into the plasma chamber, bringing the target and chamber up to temperature before the process can begin, and reversing these steps before unloading adds a significant time overhead to the process.

A further issue that arises with hydrogenation is that the 'in-diffusion' of atomic hydrogen that occurs during the hydrogenation process will be counteracted by an "out-diffusion" in some circumstances. In particular, if the target is removed from the plasma whilst still at a high temperature, out-diffusion may result in all of the previously in-diffused hydrogen being lost.

Another factor which must be considered is the occurrence of dopant (e.g. boron) deactivation and surface damage which will occur when a silicon film is exposed to atomic hydrogen, especially at lower temperatures. Such damage can include etching and creation of surface defects (e.g. platelets and voids) and has an adverse affect on device performance and can cancel the benefits of hydrogenation. Surface damage may become a significant problem if a target remains exposed to atomic hydrogen at temperatures below approximately 300-350° C., (depending on the intensity of atomic hydrogen and the CSG material quality) for significant periods of time.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date of each claim of this application.

SUMMARY OF THE INVENTION

According to a first aspect, a method is provided for hydrogenation of a target using an atomic hydrogen source, the method comprising processing the target by subjecting at least one area of the target to intermittent exposure of an atomic hydrogen field of the source of atomic hydrogen until the at least one area of the target has been subjected to the atomic hydrogen field for a predetermined minimum period of time.

In one embodiment the method comprises simultaneously subjecting the whole target to the atomic hydrogen field of the source of atomic hydrogen and the source is a pulsed source with pulse durations in the range of 2 seconds to 2 minutes and the duty cycle is approx 50% or less while the target is within the predetermined processing temperature range.

Preferably the method comprises establishing a processing area dictated by an atomic hydrogen field of the atomic hydrogen source the processing area being smaller than the target, the method further comprising:

a) moving the target to be processed into a high temperature processing zone containing the processing area;

b) translating the target within the high temperature processing zone while processing successive areas of the target by intermittently subjecting them to exposure of the atomic hydrogen field until all of the target has been processed for a predetermined minimum period of time;

c) after all of the target has been processed for the predetermined minimum period of time, removing the target from the high temperature processing zone.

The target is preferably inserted into the high temperature processing zone via a first input path and removed from the high temperature processing zone via a second output path whereby a new target may be loaded into the high temperature processing zone simultaneously with the removal of the previous target.

The method preferably further comprises:

a) raising the temperature of a clean target to a temperature within the predetermined processing temperature range;

b) processing the target by subjecting the at least one area of the target to intermittent exposure of the atomic hydrogen field of the source of atomic hydrogen until the at least one area of the target has been subjected to the atomic hydrogen field at temperatures in the predetermined processing temperature range for the predetermined minimum period of time;

c) after the at least one area of the target has been subjected to the atomic hydrogen field for a predetermined minimum period of time at temperatures within the predetermined processing temperature range, rapidly cooling the target while still intermittently exposing the at least one area of the target to an atomic hydrogen field; and d) terminating exposure of the target to the atomic hydrogen when the target reaches a predetermined lower temperature limit.

According to a second aspect, a method is provided for hydrogenation over a large planar area target using discrete localised intense atomic hydrogen sources, the method comprising:

a) raising the temperature of a clean target to a temperature within a predetermined processing temperature range;

b) moving the heated target through one or more fields of atomic hydrogen whereby only a portion of the area of the target is in any one atomic hydrogen field at any time and continuing the movement of the target until at least one area of the target has been subjected to an atomic hydrogen field for a predetermined minimum period of time;

c) after the at least one area of the target has been subjected to an atomic hydrogen field for a predetermined minimum period of time at temperatures within the predetermined processing temperature range, rapidly cooling the target while still moving the target through the one or more atomic hydrogen fields; and d) terminating exposure of the target to the atomic hydrogen fields when the target reaches a predetermined lower temperature limit.

Preferably, the target is inserted and removed from the high temperature processing zone via different paths whereby a new target may be loaded into the high temperature processing zone while the previous target is removed.

Preferably also, the source comprises a plurality of discrete localised intense atomic hydrogen sources, each providing a field of atomic hydrogen establishing a respective processing area which is smaller than the target, the method further comprising moving the heated target through one or more of the plurality of fields of atomic hydrogen whereby only a portion of the area of the target is in any one atomic hydrogen field at any time and continuing the movement of the target until all of the area of the target has been subjected to an atomic hydrogen field for a predetermined minimum period of time.

According to a third aspect, a method is provided for pulsed hydrogenation of a target using atomic hydrogen sources, the method comprising:

a) raising the temperature of a clean target to a temperature within a predetermined processing temperature range;

b) intermittently exposing the target to an atomic hydrogen field of the source of atomic hydrogen by pulsing the source until all of the target has been subjected to the atomic hydrogen field for a predetermined minimum period of time;

c) after all of the target has been subjected to the atomic hydrogen field for a predetermined minimum period of time at temperatures within the predetermined processing temperature range, rapidly cooling the target while still exposing the target to the atomic hydrogen field of the source; and d) terminating exposure of the target to the atomic hydrogen when the target reaches a predetermined lower temperature limit;

wherein the source is pulsed with pulse durations in the range of 2 seconds to 2 minutes and the duty cycle is approx 50% or less while the target is within the predetermined minimum processing temperature range.

According to a fourth aspect a method of transporting a large planar area target on a glass substrate in a high-temperature process without a carrier is provided, the method comprising:

a) providing a set of transport rollers to transport the target and substrate through a processing area, the rollers providing support for the substrate on a predetermined maximum pitch;

b) placing the substrate on the rollers and moving the substrate and associated target into the processing area;

c) raising the temperature of the target and glass substrate to a temperature within a predetermined process temperature range which may be greater than both a strain point and an annealing point temperature of the substrate;

d) moving the heated target and substrate through one or more processing areas while at temperatures in the process temperature range;

e) while the substrate is at a temperature within the predetermined temperature range, substantially maintaining the substrate in motion, with substrate motion determined by the pitch of the rollers, the type of glass and the process temperature range, whereby any significant distortion of the substrate is avoided; and f) after processing within the predetermined process temperature range is completed, cooling the substrate to a temperature below which distortion will not occur.

According to a fifth aspect, a method is provided for processing a target using a processing area smaller than the target, the method comprising:

a) moving the target to be processed into a high temperature processing zone containing the processing area;

b) translating the target within the high temperature processing zone while processing successive areas of the target until all of the target has been processed for a predetermined minimum period of time;

c) after all of the target has been processed for the predetermined minimum period of time, removing the target from the high temperature processing zone.

According to a sixth aspect, an apparatus is provided for hydrogenation of a large area target using discrete localised intense atomic hydrogen sources, the apparatus comprising:

a) a high temperature processing zone operable at temperatures in a predetermined processing temperature range including one or more intense localised atomic hydrogen sources producing fields of atomic hydrogen whereby the high-temperature processing zone is large enough to accommodate target areas greater than an area covered by the atomic hydrogen fields and whereby only a portion of the area of the target is in any one atomic hydrogen field at any time;

b) heating means to heat the target to temperatures within the predetermined processing temperature range; and c) transport means arranged to move the target through the atomic hydrogen fields in the high temperature processing zone to progressively expose at least an area of the target to an atomic hydrogen field in the high-temperature processing zone for a predetermined minimum period of time while keeping the temperature in the predetermined processing temperature range.

Preferably, the apparatus further comprises cooling means to allow cooling of the target to a temperature below a predetermined lower temperature, and wherein the transport means after the entire target has been exposed to the atomic hydrogen field in the high-temperature processing zone for a predetermined minimum period of time, further moves the target to progressively expose the entire target to an atomic hydrogen field while subjecting the target to the cooling means until a predetermined lower temperature limit is reached.

Preferably also the apparatus comprises:

a) a heating zone into which a clean target is introduced to be heated to a temperature within or near a predetermined processing temperature range;

b) a cooling zone, which provides the cooling means, the cooling zone including one or more atomic hydrogen sources producing fields of atomic hydrogen, the cooling zone being large enough to accommodate target areas greater than an area covered by the atomic hydrogen fields and whereby only a portion of the area of the target is in any one hydrogen field at any time;

c) heating means in the heating zone to heat the target to temperatures within the predetermined processing temperature range; and d) transport means arranged to move the target through the heating zone into the high temperature and cooling zones and to move the target through the atomic hydrogen fields in cooling zone to progressively expose the entire target to an atomic hydrogen field in the cooling zone until the predetermined lower temperature limit is reached.

According to a seventh aspect, an apparatus is provided for hydrogenation of a large area target using discrete localised intense atomic hydrogen sources, the apparatus comprising:

a) a heating zone into which a clean target is introduced to be heated to a temperature within or near a predetermined processing temperature range;

b) a high temperature processing zone operable at temperatures in the predetermined processing temperature range including one or more intense localised atomic hydrogen sources producing fields of atomic hydrogen whereby the high-temperature processing zone is large enough to accommodate target areas greater than an area covered by the atomic hydrogen fields and whereby only a portion of the area of the target is in any one atomic hydrogen field at any time;

c) a cooling zone including one or more atomic hydrogen sources producing fields of atomic hydrogen whereby the cooling zone is large enough to accommodate target areas greater than an area covered by the atomic hydrogen fields and whereby only a portion of the area of the target is in any one hydrogen field at any time;

d) heating means in the heating zone and the high temperature processing zone to heat the target to temperatures within the predetermined processing temperature range; and e) transport means arranged to move the target through the heating, high temperature and cooling zones and to move the target through the atomic hydrogen fields in the high temperature and cooling zones to progressively expose the entire target to an atomic hydrogen field in the high-temperature processing zone for a predetermined minimum period of time, and to progressively expose the entire target to an atomic hydrogen field in the cooling zone for a period of time until a predetermined lower temperature limit is reached.

In some embodiments of the hydrogenation apparatus, the heating zone is also provided with one or more atomic hydrogen sources, producing fields of atomic hydrogen, whereby the target may be exposed to atomic hydrogen during the heating step.

Preferably the target to be hydrogenated is a thin polycrystalline silicon film located on a glass substrate and the target is cleaned prior to exposure to atomic hydrogen fields by applying a dilute hydrofluoric acid (HF) etch.

A low moisture environment is preferably maintained in each zone to minimise oxide growth during high temperature processing. $H_2O/H_2$ ratios of less than 1000 ppm are desirable to achieve good results and preferably ratios of 200 ppm or less will be achieved. Atomic hydrogen levels are also preferably maintained in the high-temperature processing zone and the cooling zone that will reduce any oxide growth that occurs on the polycrystalline silicon film.

The predetermined high-temperature processing temperature range will in the case of some glass types be selected to be greater than both a strain point and an annealing point temperature of the glass substrate. For solid phase crystallized polycrystalline silicon on borosilicate glass (BSG) the predetermined processing temperature range (measured at the target surface) will typically be in the order of 570° C.-650° C. and preferably the range of 600° C.-620° C. will be used, whereas the strain point for this glass is 518° C. and the annealing point is 560° C.

In a preferred apparatus, a processing chamber is provided which contains the heating zone, the high temperature processing zone and the cooling zone. An entry load lock is provided in the preferred apparatus to allow easy insertion of the target into the processing chamber where it is heated to a temperature within or approaching the predetermined processing temperature range. The target is then introduced into a high temperature processing zone in which atomic hydrogen sources are provided to generate the atomic hydrogen fields.

After the high temperature process has been completed in the high temperature processing zone, the target is passed from the high temperature processing zone to a cooling zone in which one or more atomic hydrogen sources are provided to generate the atomic hydrogen fields to which the target is subjected during cooling. The one or more atomic hydrogen sources of the cooling zone are preferably operated at a lower power than those in the high temperature processing zone. The cooling zone is also preferably provided with cooling means to rapidly reduce the temperature of the target to the predetermined lower temperature limit. The lower temperature limit will generally be in the range of 300-350° C.

The exposure of the target to atomic hydrogen will be ceased after the target reaches the lower temperature limit while further cooling continues. At temperatures below the lower temperature limit out diffusion will be significantly reduced removing the need for exposure to atomic hydrogen and so by removing the exposure the possibility of further atomic hydrogen-induced surface damage is also removed. Preferably the cooling zone is capable of cooling the target to the predetermined lower temperature limit in less than 10 minutes and in the preferred apparatus in less than 5 minutes. Preferably the exposure to atomic hydrogen is ceased by turning off the atomic hydrogen source in the cooling zone.

An output load lock is provided in the preferred apparatus to allow easy removal of the target from the cooling zone of the processing chamber.

A means of transport is provided to move the target forwards and backwards in an oscillating motion through the processing area until the required processing time has been achieved. In particular the target is moved through one or more atomic hydrogen fields of the high-temperature processing zone to achieve the required exposure time over the entire surface of the target. In the preferred apparatus, rollers are provided to transport the target, while avoiding significant distortion of the substrate by maintaining substrate motion within predetermined parameters for the particular substrate and processing temperature. Distortion will be affected by the viscosity of the substrate at the processing temperature, the pitch at which the rollers are spaced and the average speed at which the substrate is moved. In the case of a borosilicate glass substrate used in a process running at 610° C. the roller pitch will be in the range of 200-600 mm and preferably about 350 to 370 mm, and the transport speed will be in the range of 0.5-8.0 m/min.

BRIEF DESCRIPTION OF THE DRAWINGS

Embodiments of the invention will now be described, by way of example, with reference to the accompanying drawings in which.

DETAILED DESCRIPTION OF EXAMPLES

Referring to the drawings, a description of a preferred apparatus and method for obtaining fast, effective hydrogenation of polycrystalline silicon on glass whilst avoiding atomic hydrogen-induced surface damage will now be described. In this embodiment intense atomic hydrogen exposure for hydrogenation during high temperature processing and cool-down is balanced against silicon surface damage by reducing atomic hydrogen exposure for part or all of the cooling stage (e.g. by reducing plasma power of a plasma source at the start of or during the cool-down stage) and by terminating hydrogen exposure at a minimum temperature approximately in the range 300-350° C.

In-Line Hydrogen Passivation Tool

Figure 1:
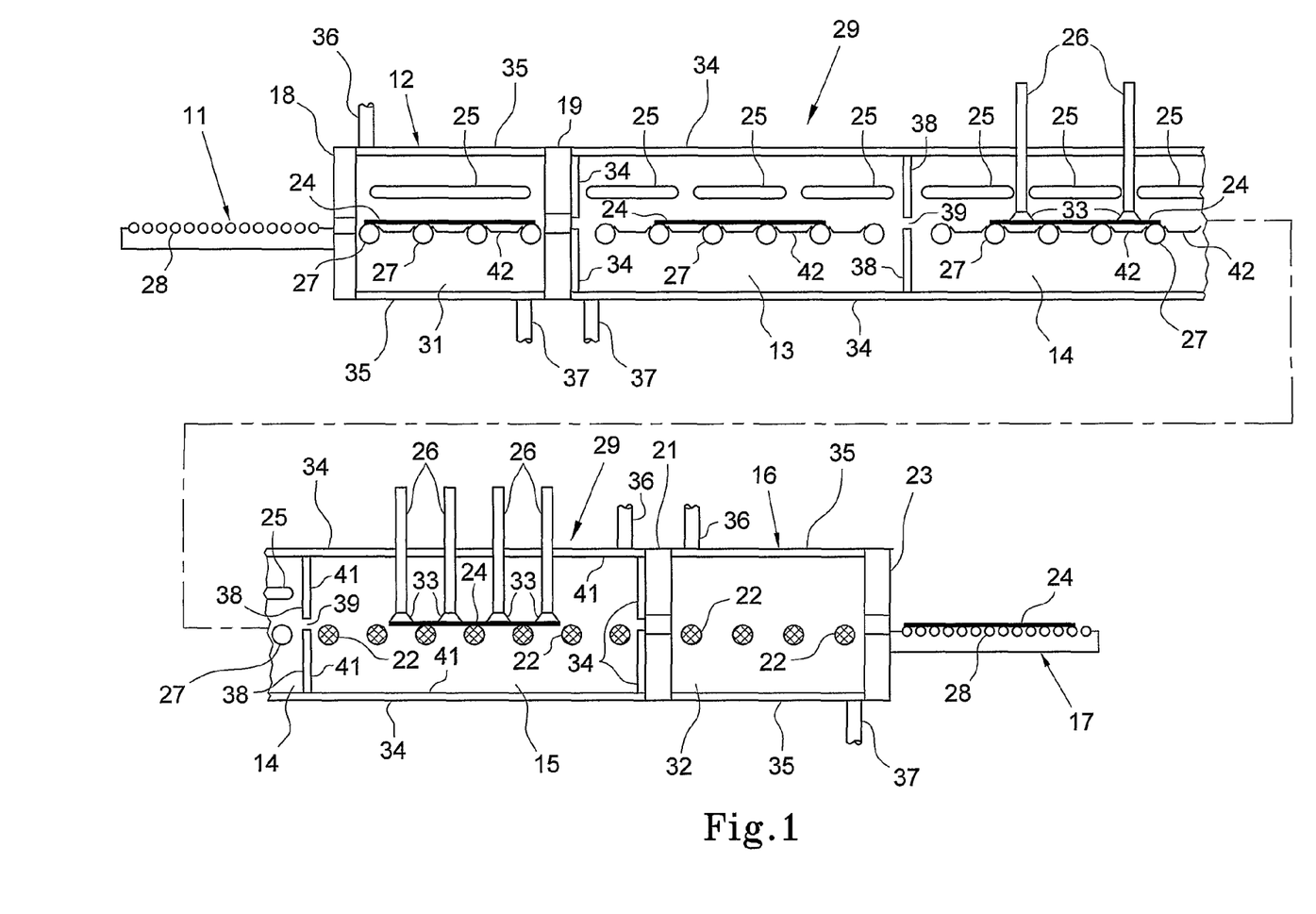
FIG. 1 is a schematic diagram of a tool for hydrogen passivation of large panels of crystalline silicon on glass substrate.

Referring to FIG. 1 of the accompanying drawings a preferred hydrogenation tool comprises an entry table 11, an entry load lock 12, a processing chamber 29 an exit load lock 16 and an exit table 17. The processing chamber 29 contains a heating zone 13, a high temperature processing zone 14 and a cooling zone 15.

The entry and exit tables 11, 17 are respectively located outside the entry and exit load locks 12, 16 to support the work piece 24, before and after it is in the tool. Each of these tables include a supporting surface defined by a plurality of rollers 28 which facilitate movement of the work piece into the entry load lock and out of the exit load lock respectively.

The entry load lock 12 comprises an outside gate 18 and an inside gate 19 which between them define a closed chamber 31 when the gates are closed. Within the entry load lock the work piece 24 is supported on rollers 27 to move the work piece through the tool. The rollers 27 in the entry load lock are ceramic to tolerate high temperatures and are motor driven under control of a process controller (not shown), to move the work piece through the load lock. The entry load lock 12 also includes a heater 25 preferably comprising an array of incandescent lamps. The rollers are spaced on a pitch of 400 mm. The exit load lock 16 is similarly configured to the entry load lock 12 with an inside gate 21 and an outside gate 23, which between them define a closed chamber 32 when the gates are closed, and motor driven rollers 22 to support the work piece 24 while in the load lock. However the exit load lock 16 does not include a heater. The rollers 22 in the exit load lock are metal (aluminium) as they never reach high temperatures and if ceramic rollers were used they would continue to outgas $H_2O$, which would reduce performance of the devices passing through the tool.

The processing chamber 29 is also a closed chamber when the inside gates 19, 21 of the entry and exit load locks 12, 16 are closed (or indeed effectively when either of the gates of each load lock are closed, which is always the case while the chamber is in use). In the heating and high temperature processing zones, the work piece is supported on further rollers 27 which enable movement of the work piece through the tool. As for the rollers 27 in the entry load lock, the rollers 27 in the heating and high temperature processing zones are ceramic to tolerate high temperatures and are motor driven under control of a process controller (not shown), to move the work piece through the tool. In the cooling zone the rollers 22 are metal (aluminium) as for the exit load lock. The rollers in the processing chamber are spaced on a pitch of 360 mm.

The heating zone 13 and high temperature processing zone 14 are each provided with heaters 25 each preferably comprising an array of incandescent lamps. These lamps enable the work piece to be heated to at least 650° C. or higher.

Figure 2:
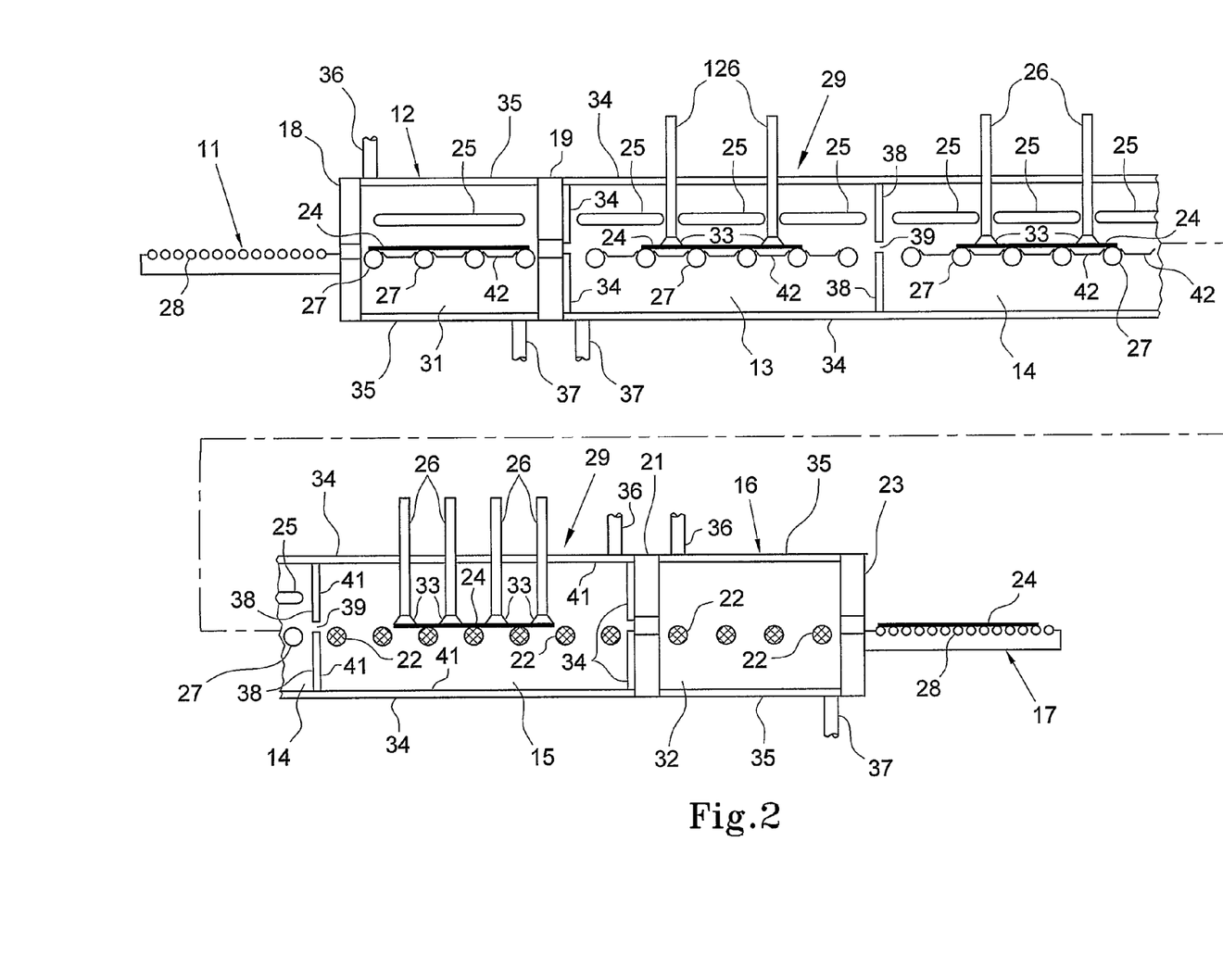
FIG. 2 is a schematic diagram of the tool of FIG. 1 with optional additional atomic hydrogen sources provided in a heating zone thereof.

Atomic hydrogen sources 26 are provided in the high temperature processing zone 14, and the cooling zone 15. Referring to FIG. 2, atomic hydrogen sources 126 may optionally also be provided in the heating zone 13. The atomic hydrogen sources are discrete localised intense atomic hydrogen sources and may be plasma sources such as rf inductively-coupled plasma sources or microwave-excited linear plasma sources however they may also be non-plasma sources such as thermal gas crackers. In either case the field of atomic hydrogen 33 will be relatively compact when compared with the size of any of the process zones of the processing chamber 29 (i.e. heating zone 13, high temperature processing zone 14 or cooling zone 15), hence the need to oscillate the work piece 24 under the atomic hydrogen sources to achieve coverage of the entire target surface area of the workpiece.

The walls 34 of the processing chamber 29 as well as the walls 35 and gates 18, 19, 21, 23 of the load locks 12, 16 are water cooled, the coolant being supplied to the tool via coolant inlets 36 and removed from the tool via coolant outlets 37. Within the processing chamber 29, the heating zone 13, high temperature processing zone 14, and cooling zone 15 are separated by water cooled barriers 38 which almost completely close each zone and provide a high degree of thermal isolation between adjacent zones. The barriers 38 are provided with narrow openings 39 which allow passage of the work pieces 24 from one zone to another.

In order to maximize cooling within the cooling zone 15, the inner surfaces 41 of the walls 34 and the barrier 38 within the cooling zone are unpolished to provide low emissivity. Within the entry load lock 12, the heating zone 13 and high temperature processing zone 14, polished radiation shields 42 are provided between the rollers 27 below the path of the workpiece 24 to reflect radiated heat.

Other characteristics of the processing tool are:—

1. The processing chamber 29 operates in a (partial) vacuum. The plasma type atomic hydrogen sources 26, which have so far been demonstrated to provide best results, require low pressure. The load locks 12, 16 and the processing chamber 29 enable low pressure processing.

2. Separate zones 13, 14, 15 are provided in the processing chamber 29 for heating, high-temperature hydrogen exposure and cool-down hydrogen exposure. A multi-zone approach facilitates an in-line production tool where each zone can be separately optimised. This is particularly important for the cool zone, where controlled termination of hydrogen exposure enables optimal performance. It also allows for rapid heating and cooling of CSG by avoiding thermal cycling of the hydrogen zones.

3. An in-line tool is compatible with high-throughput, large-scale production. It also makes attaining uniform total hydrogen exposure much easier (in the travel axis).

4. Roller transport is provided for the work piece. Use of in-line rollers 22, 27 to transport the workpiece without the support of a setter, facilitates rapid glass heating and cooling, as well as accurate glass temperature monitoring via pyrometers. Roller transport is also compatible with further process improvements and innovations.

5. The use of lamp heaters in the heater arrays 25 provide a rapid heating capability, including substantial preheating in the load-lock.

6. Sequential oscillatory transport is employed in the processing chamber 29 and the entry load lock 12. The work pieces are moved in an oscillatory fashion in each of the processing zones (high temperature processing zone 14 and cooling zone 15) to extend the time spent under the atomic hydrogen sources for a given translation speed. Also, in the entry load lock 12 and the heating zone 13, the work pieces are moved in an oscillatory fashion to evenly distribute the effects of the heating lamps. Compared to continuous travel, this makes it easier to coordinate and optimise the overall process, as each stage can be separately optimised in terms of transport speed and timing. For the heating and high-temperature processing zones, this includes ensuring that glass deformation (e.g. roller-wave distortion) remains compatible with subsequent device processing and aesthetic requirements, by using an appropriate combination of transport parameters and roller pitch. (The use of a setter would also reduce deformation, but would introduce a significant consumable cost and increases heating and cooling times because of extra thermal mass.)

7. Plasma devices are used as the atomic hydrogen sources. The in-line tool and roller transport concept is compatible with many different types of hydrogen plasma generation techniques, such as LPS (linear plasma source), ICP (inductively couple plasma), ECR (electron cyclotron resonance), and parallel-plate sources. The use of non-plasma sources is also potentially possible but at present plasma sources are preferred.

8. The process and tool are designed for maximum and uniform delivery of atomic hydrogen to the sample. The 'throw distance' of atomic hydrogen is quite small, and is strongly dependent on the chamber wall material, where recombination can occur. Consequently, coupling between the remote-plasma source and sample may be lined with a low-recombination material (e.g. quartz). By contrast, stainless steel (especially when hot) has a higher recombination coefficient for atomic hydrogen. Importantly, exposed CSG 'consumes' atomic hydrogen (by in-diffusion and passivation, surface damage processes, or through surface recombination/oxide reduction). In the present embodiment the atomic hydrogen field is restricted to the area directly under the source.

The combination of these preferred tool features provides a high throughput, scalable, in-line tool which is a platform suitable for large-scale manufacturing.

Hydrogen Passivation Method

The preferred method for obtaining effective hydrogenation over a large planar area makes use of localised (discrete) intense atomic hydrogen sources (nominally plasma sources). The substrate carrying the target to be processed is translated through a field of atomic hydrogen extending from localised atomic hydrogen sources to obtain uniform hydrogenation over the target surface.

Figure 3A:
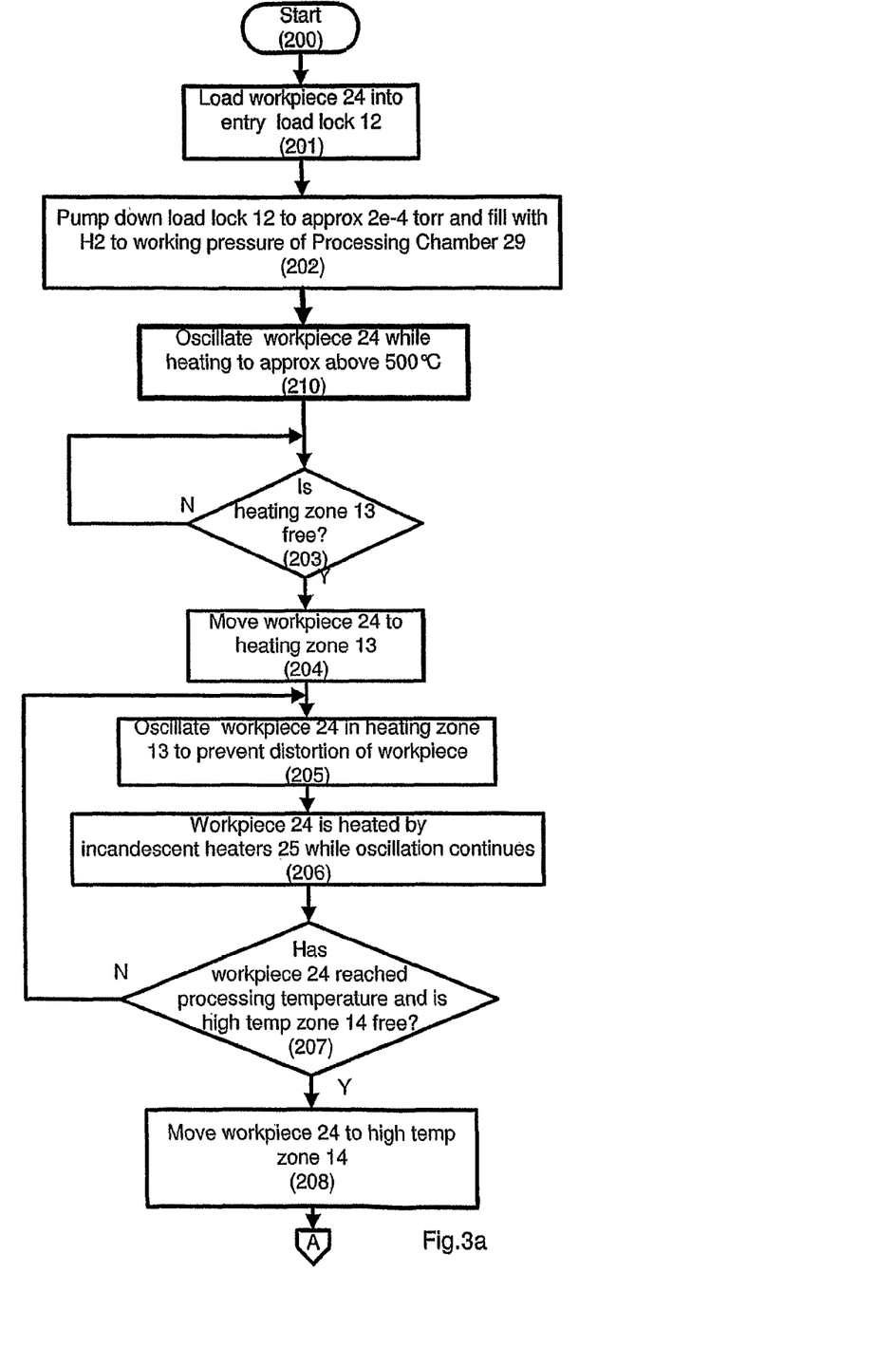
FIGS. 3a, 3b & 3c show a flow chart of the preferred hydrogen passivation method.
Figure 3B:
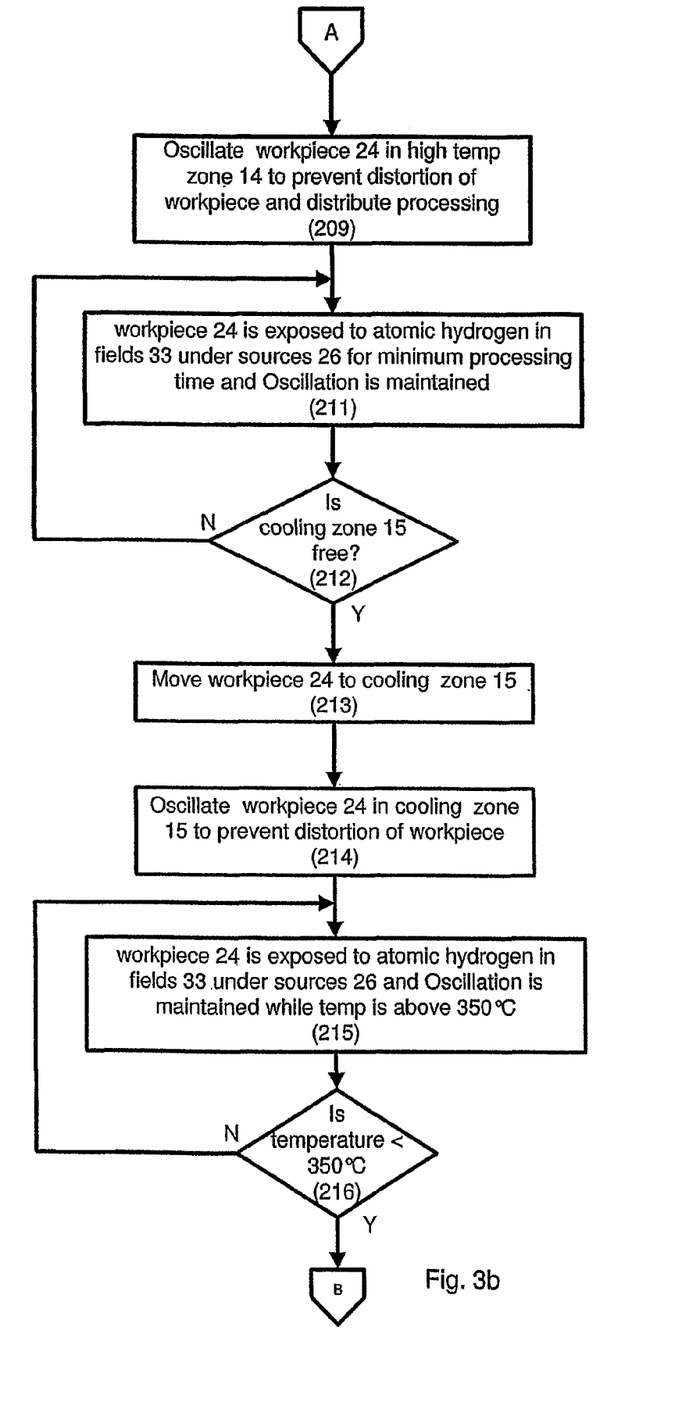
Figure 3C:
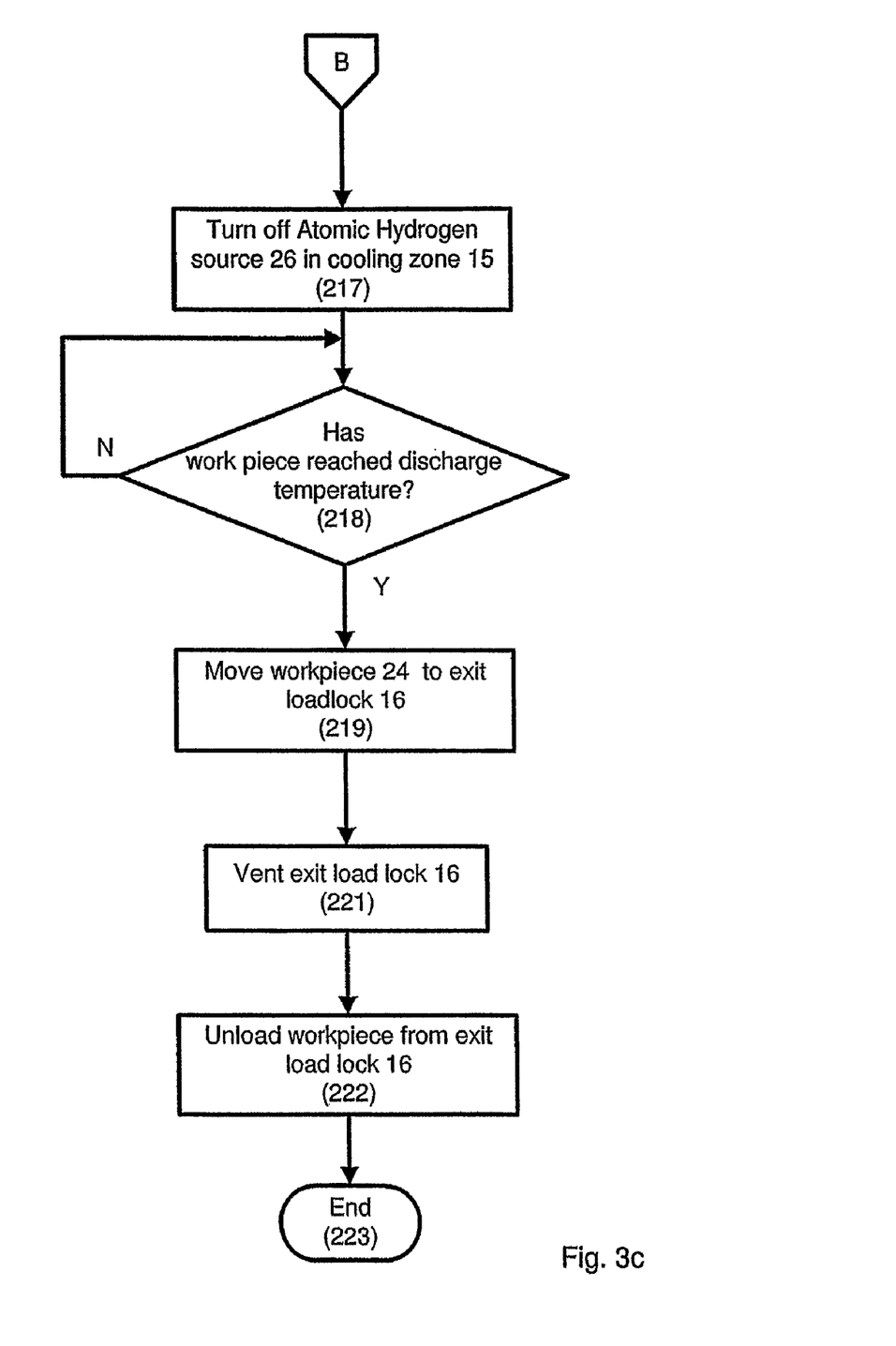

Referring to FIGS. 3*a*, 3*b* & 3*c*, as well as FIG. 1, the preferred hydrogenation method is performed at low pressure (partial vacuum) and therefore the first steps in the process are to load 201 the workpiece 24 into the entry load lock 12, and to pump down 202 the pressure in the load lock to approximately 0.2 mtorr before filling the load lock with hydrogen to the working pressure of the processing chamber 29. The workpiece 24 is then heated 210 to above approximately 500° C. while being translated in an oscillatory manner to provide uniform heating and to prevent distortion due to exposure to higher temperatures over the rollers. Once the required temperature is reached a check is made 203 that the heating zone 13 of the processing chamber 29 is free before moving 204 the workpiece into the heating zone. Before the hydrogenation process can begin, the workpiece 24 (substrate and target) is heated 206 to a temperature equal to or at least approaching the process temperature. While being heated, particularly as the temperature reaches the upper limit, the workpiece 24 is translated in an oscillatory manner 205 within the heating zone 13 to avoid distortion of the substrate. This heating step is performed outside the main hydrogenation processing chamber to minimise the time that the target spends in the processing chamber and to thereby improve throughput. Optionally the target may also be subjected to atomic hydrogen during the heating phase (see FIG. 2). The exposure to atomic hydrogen in the heating phase may be at a reduced level to that in the main processing chamber. Once the workpiece 24 reaches 207 the temperature required in the high temperature processing zone 14 of the processing chamber 29 it is moved 208 into the high temperature processing zone, and whilst still maintaining the high temperature the workpiece is translated 209 about (or through) area(s) of high atomic hydrogen concentration within the processing chamber, to expose 211 the target using the same oscillatory translation that is used to avoid distortion. Such translation can be repeated as many times as required. As such the atomic hydrogen sources 26 can be 'isolated' from the substrate heating arrays 25 but still be used to obtain uniform hydrogenation.

Once the entire target area of the workpiece 24 has been exposed to atomic hydrogen for the required period of time the cooling zone 15 is checked 212 to see that it is free and the workpiece is moved 213 into the cooling zone. The workpiece 24 is translated in an oscillatory manner 205 within the cooling zone 15 to avoid distortion of the substrate while it is still at elevated temperatures. While the workpiece 24 (and especially the target) is at elevated temperature, exposure to atomic hydrogen continues 214 via the atomic hydrogen sources 26 in the cooling zone 15 and translation 214 of the workpiece 24 continues under the sources 26 to evenly expose the target area. The plasma power of the atomic hydrogen sources 26 in the cooling zone 15 may optionally be reduced (relative to the sources in the high temperature processing zone 14) either at the commencement of the cooling phase 215 or after the workpiece 24 has cooled to a predetermined temperature. Once the temperature drops 216 to 350° C. the supply of atomic hydrogen ceases 217 and after further cooling, when the workpiece reaches a discharge temperature 218 it is moved 219 to the exit load lock 16, and the exit load lock is then vented 221 before the workpiece is unloaded 222.

Each process zone 13, 14, 15 can be optimised, both in terms of process parameters and physical configuration, to meet the requirements of a particular stage in the hydrogenation process, for example: substrate heating, high-temperature atomic hydrogen exposure and rapid cool under atomic hydrogen exposure. The translation motion 210, 205, 206, 209, 211, 214, 215 can be either continuous in-line or stepped (oscillatory) in-line. In the case of a stepped in-line sequence the translation between zones should be rapid to minimise impact upon hydrogenation. The translation will generally be cyclic with the target being moved forward and backward through the atomic hydrogen field to achieve full processing of the target surface for the required duration. This technique effectively delivers a series of pulses of atomic hydrogen exposure to each point on the target surface to deliver the required level of hydrogen exposure. Out-diffusion will occur from areas of the target which are not currently being exposed to atomic hydrogen (or where the exposure level is light) and the exposure time per unit area must be balanced against the time that the target is unexposed at elevated temperatures to obtain a net positive result.

The glass substrates of the workpieces 24 are translated through the tool on rollers whilst being hydrogenated, the roller motion being tailored (pitch, speed, oscillation, etc) to eliminate deformation of the substrate. Using this technique when performing high-temperature hydrogenation on glass substrates, eliminates the need for a substrate carrier, allows relatively uniform and rapid glass heating and cooling, and eliminates glass sticking to a carrier or chuck, and provides a practical method of performing hydrogenation of glass substrates at high temperatures.

Key features of a preferred hydrogenation method are:—

1. The silicon surface is cleaned prior to processing and is kept clean during hydrogenation to avoid contamination or barriers to hydrogen transport. Prior to hydrogenation any oxide on the surface is removed using a dilute HF etch. During hydrogenation, in-situ oxide growth is minimised by ensuring sufficiently low water vapour in the process chamber as well as by exposure to sufficiently high concentrations of atomic hydrogen to continuously 'reduce' any growing oxide.
2. The main atomic hydrogen processing is performed at high temperature. The current optimum temperature for performing the atomic hydrogen exposure is 610° C., which is greater than the glass strain and annealing points for BSG (518° C. and 560° C. respectively), and much higher than the processing temperatures reported by other groups working on non-nitride based hydrogenation of multicrystalline silicon wafers.
3. The hydrogen exposure is intense. The targets are passed in relatively close proximity to intense plasma sources, providing exposure to high concentrations of atomic hydrogen. Both rf inductively-couple plasma sources and microwave-excited linear plasma sources have been used with success.
4. The hydrogen exposure is fast. Atomic hydrogen exposure times of 4 to 10 minutes are adequate at the proposed temperatures.
5. The exposure of the target to atomic hydrogen is maintained during cooling of the target (and substrate), until the target reaches a temperature of approximately between 300-350° C. Maintaining exposure during cooling has been shown to provide an increase in efficiency of more than 33% through an increase in V(0.1) by more than 100 mV over cells where exposure was ceased for the cooling step. (Note—the term V(0.1) used here and below refers to the open-circuit voltage at one-tenth of a sun illumination. The parameter V(0.1), approximates the junction voltage at maximum power point, and is a sensitive measure of the effect of hydrogenation on CSG used in process optimisation)
6. The target is rapidly cooled. Rapidly cooling the target, while maintaining hydrogen exposure, dramatically improves cycle times and manufacturability without loss of module performance. Cool-down times as short as 3 to 4 minutes have been demonstrated, with essentially no performance difference when compared to tool-limited cooling times of up to 2 hours.
7. The hydrogen-plasma termination point is kept above a predetermined minimum temperature. It has been found that the combination of intense atomic hydrogen exposure and low temperature is detrimental to performance because of hydrogen-induced surface damage to the silicon, including etch damage. The trade-off between passivation and etch damage can be optimised by terminating the plasma and therefore hydrogen exposure at CSG surface temperatures between 300 and 350° C.
8. The plasma power is reduced during the cool-down stage. Again to avoid excessive etch damage, it has been found that stepping down the plasma power either at the start of or during the cool-down stage is beneficial.
9. The hydrogen ($H_2$) gas flow is maximized. Reduced flows of hydrogen lead to strong flow effects whereby the atomic hydrogen is depleted and hence passivation reduced. Within the hydrogenation tool the maximum gas flow compatible with pump capacity and desired process pressure is used.
10. The optimum operating pressure is found to be between about 30 and 100 mtorr.

EXPERIMENTS

Experiment 1

Intermittent Atomic Hydrogen Exposure

The objective of this experiment was to test passivation processes involving a maximum 50% duty cycle for plasma exposure, with pulse durations as long as 6 min. The motivations for this work are:

1. Equipment lifetime—A plasma source operated with a duty cycle is likely to last longer than one run continuously, benefiting factory hydrogenation in terms of cost and reliability;
2. Performance—It is possible that such an interrupted plasma process will provide better passivation than continuous plasma exposure.

Each test run was performed in a small research hydrogenation tool for 15×15-cm CSG samples (hereinafter referred to as the 'research tool') and commenced as follows:

(i) 5 minute chamber pump down at room temperature,
(ii) 5-min ramp to heater set point of 702° C. (glass temperature ~608° C.),
(iii) 10-min stabilisation=3 min in vacuum+7 min in process ambient
(iv) Run test as per table 1.

TABLE 1

| Sample # | Plasma details |
|---|---|
| 1-4 | Plasma on for 6 minute plateau, off for 6 minute cool, on for 6 minute till end cool down (glass temperature ~515 to 425° C. over final 6 minutes). |
| 5-8 | Plasma on for 6 minute plateau, off for 13 minute cool, on for 6 minute till end cool down (glass temperature ~410 to 350° C. over final 6 minutes). |
| 9-12 | 2 minute pulse duration (automated) for 10 minute plateau (off/on/off/on/off) and cool down to a glass temperature of ~360° C. |
| 13-16 | 1 minute pulse duration (automated) for 10 minute plateau (starting with off) and cool down to a glass temperature of ~360° C. |
| 17-20 | Plasma on only for 6 minute plateau. (Cool down without plasma, but with gases, to a glass temperature of ~360° C.). |

All samples were from the same sheet of CSG material. A middle piece from this sheet (designated sample KF298V01) was passivated in the research tool using continuous plasma exposure and used as a control sample.

TABLE 2

| Sample | Voc (mV) | V1 (mV) | V2 (mV) | V(0.1) (mV) |
|---|---|---|---|---|
| KF298V01 | 483 | 486 | 601 | 414 |
| 1-4 | 453 | 455 | 553 | 380 |
| 5-8 | 429 | 435 | 505 | 351 |
| 9-12 | 465 | 466 | 596 | 403 |
| 13-16 | 467 | 467 | 592 | 403 |
| 17-20 | 383 | 396 | 435 | 299 |

The results in Table 2 suggest that the process with the 50% duty cycle and 1-2 minute pulse duration is actually as good as the previously accepted best process. The termination temperature in the experimental process was more than 50° C. higher than optimal which will fully account for the 10 mV deficit in V(0.1).

Experiment 2

Rapid Cooling in Research Tool

The object of this experiment was to determine the effects of rapid cooling on device performance (voltage). Rapid cooling will improve the economics of in-line passivation by permitting shortened cycle times. This experiment tested the shortest hydrogenation cycles attempted to that date, with plateaus <10 minutes and cool down times of less than 7 minutes. The research tool was modified to allow rapid cooling of two 5×5-cm samples, by pushing them off of a susceptor into an upstream cool zone which allowed dramatically improved glass cooling times.

The basic process was:
  i) 5 minute room temperature pump down,
  ii) 5 minute ramp to the heater set point of 750° C. (glass temperature 610° C.),
  iii) 10-min stabilisation–3 minutes in vacuum+7 minutes in process ambient, prior to plasma exposure.
  iv) run test as per table 4.
  v) after the plasma is extinguished, the gases are shut off and the throttle open.
  vi) in the case of rapid cooling, the chamber is vented once the heater cools to <400° C.

TABLE 3

| Cooling rate | Time (min) to 400° C. | 350° C. | 300° C. | 250° C. |
|---|---|---|---|---|
| Standard | 15 | 20 | 26 | ~35 |
| Rapid | 2.5 | 3.5 | 5 | 7 |

All samples were from the same sheet of CSG material.

First results with rapid cooling (Samples 3 & 4) were disappointing, with V(0.1) nearly as bad as having no plasma at all during cool down The remaining rapid cooling experiments were run using a continuous exposure to atomic hydrogen during cooling (in all cases the plasma was pulsed for the high temperature atomic hydrogen exposure step).

TABLE 4

| Sample | Cooling | Plasma (min) | Plasma when cooling | Terminal Temp (° C.) | Voc (mV) | V1 (mV) | V2 (mV) | V(0.1) (mV) |
|---|---|---|---|---|---|---|---|---|
| 1-2 | std | 10 + 26 = 36 | plsd | 300 | 463 | 466 | 569 | 394 |
| 3-4 | rapid | 10 + 5 = 15 | plsd | 300 | 398 | 412 | 449 | 314 |
| 5-6 | rapid | 10 + 7 = 17 | cts | 250 | 468 | 471 | 574 | 397 |
| 7-8 | rapid | 10 + 5 = 15 | cts | 300 | 467 | 470 | 581 | 398 |
| 9-10 | std | 10 + 35 = 45 | cts | 250 | 476 | 478 | 627 | 410 |
| 11-12 | rapid | 5 + 5 = 10 | cts | 300 | 468 | 472 | 570 | 398 |
| 13-14 | rapid | 5 + 3.5 = 8.5 | cts | 350 | 468 | 471 | 573 | 398 |
| 15-16 | std | 10 + 35 = 45 | plsd | 250 | 461 | 465 | 556 | 390 |
| 17-18 | rapid | 5 + 2.5 = 7.5 | cts | 400 | 462 | 465 | 561 | 391 |
| 19-20 | rapid | 5 + 3.5 = 8.5 | cts | 350 | 466 | 470 | 564 | 395 |

These first attempts at a short process involving rapid cool down are very promising for in-line manufacturing, with plasma exposure times reduced by a factor of 5 (from 45 down to less than 9 min) and little or no reduction in voltage (V(0.1) around 395 mV).

Experiment 3

Remote In-line Passivation (RIPA)

The object of this experiment was to attempt to hydrogenate four sheets of a CSG material previously proven to have a V(0.1) of 385 mV after passivation on the research tool. The RIPA atomic hydrogen exposure consisted of parking samples under the first Linear Plasma Source (LPS1) throughout the heating, atomic hydrogen exposure and cool down (with atomic hydrogen exposure) stages for Samples 1 & 2 and oscillatory sample motion between two heaters throughout the heating, atomic hydrogen exposure and cool down (with atomic hydrogen exposure) stages for Samples 3 & 4. Heating prior to exposure was for at least 8 minutes to ensure steady state, and atomic hydrogen exposure was at around 610° C. followed by a 22-minute cool down (with atomic hydrogen exposure) to around 300° C.

TABLE 5

|  | Sample | | | |
|---|---|---|---|---|
|  | 1 | 2 | 3 | 4 |
| Transport—heat | parked H1 | parked H1 | osc H1/2 | osc H1/2 |
| Atomic hydrogen exposure | parked LPS1 | Parked LPS1 | osc LPS1 +/− 19.5 cm | osc LPS1 + 3.5 cm offset +/− 3.5 cm |
| H2 flush | no | yes | yes | yes |
| H2 flow (sccm) | 500 | 900 | 900 | 900 |
| Heating time (min) | 8.5 | 12 | 14 | 13 |
| Hydrogen exposure (min) | 2 | move + 4 | 10 | 10 |
| V(0.1) (mV) | | | | |
| average | 280 | 313 | 318 | 317 |
| stdev | 84 | 86 | 17 | 51 |
| max | 335 | 352 | 347 | 360 |
| min | 0 | 0 | 277 | 95 |

This experiment demonstrates that the RIPA tool will successfully passivate CSG material. Even without any optimisation of the tool V(0.1) reached as high as 360 mV on this 385-mV proven material, and one third of Sample 4 averaged over 350 mV. However, overall sample averages were below 320 mV primarily because of plasma-induced damage to the silicon most directly exposed to the plasma source. In the worst cases (Samples 1 & 2) Voc probing indicates that the damaged band is devoid of p+ layer and has exposed n+ regions. Importantly, this lot demonstrated that sample motion during atomic hydrogen exposure improves voltage uniformity, reduces silicon damage, reduces deformation and avoids excessive built-in stress.

Experiment 4

Rapid Cooling with Intermittent Atomic Hydrogen Exposure

The object of this experiment was to test a rapid-cool process in a Remote In-line Passivation (RIPA) tool, using the baseline 10-min atomic hydrogen exposure under a first Linear Plasma Source (LPS) and then either a single pass or oscillations under a second LPS for the rapid-cool atomic hydrogen exposure. Etch-products were monitored during the rapid-cool step to help determine a suitable termination time.

The RIPA base line process uses the following parameters. Gas=H$_2$ @ 450 sccm (using two Turbomolecular Pumps with asymmetrical flow), chamber pressure=75 mtorr, Process time=10 minutes @ ~610° C. exposed to atomic hydrogen, 20-minute cool down with exposure to atomic hydrogen to ~325° C., Mean plasma power of 300 W for the high temperature atomic hydrogen exposure and first 8 minutes of cool down exposure, after which plasma power is reduced to 50 W.

TABLE 6

| Sample | Process deviations from baseline |
|---|---|
| 4 | 2 modules passivated on benchmark research tool |
| 3 | no hydrogen exposure during cool down |
| 2 | rapid cool with single 3-min pass under LPS2 and mean plasma power = 300 W |
| 5 | fast symmetrical oscillations under LPS2 with mean plasma power = 300 W until etch products excessive |
| 1 | fast symmetrical oscillations under LPS2 with mean plasma power = 300 W for 4 min, then 50 W until etch products excessive |
| 6 | baseline process |

TABLE 7

| Sample | V(0.1) (mV) Avg | Stdev | Max | Min | R-L | cf research tool | cf baseline |
|---|---|---|---|---|---|---|---|
| 4 | 401 | na | 406 | 391 | na | benchmark | +27 |
| 3 | 227 | 18 | 280 | 200 | 30 | −174 | −147 |
| 2 | 334 | 12 | 352 | 314 | 30 | −67 | −40 |
| 5 | 340 | 8 | 360 | 323 | 12 | −61 | −34 |
| 1 | 359 | 12 | 381 | 340 | −6 | −42 | −15 |
| 6 | 374 | 6 | 386 | 360 | 11 | −27 | baseline |

(1) This material achieved a V(0.1) average of 374 mV using the RIPA baseline process, with a 20 minute cool while exposed to atomic hydrogen. This is 27 mV shy of the research tool benchmark.

(2) Omitting atomic hydrogen exposure during cooling altogether reduces the V(0.1) by 150 mV (227 cf 374 mV).

(3) Of the three runs with rapid cooling in this experiment the best result is 359 mV (S1) achieved using a 6.5-minute rapid cool with 15 cm, 60 cm/min symmetrical oscillations under the second LPS, 4 minutes at 300 W followed by 2.5 minutes at 50 W. This result is encouraging but still falls 15 mV short of the RIPA baseline for this material (374 mV).

(4) Uniformity is an issue, with the standard deviation 12 mV for this rapid-cool run (S1), compared to the baseline 6 mV (S6). The weakest regions are the edges of the sample, which did not actually pass under the LPS housing during the 15 cm oscillations indicating that larger oscillations are appropriate.

(5) During the experiment the second LPS appears to have a problem with less H production at one end.

(6) Although the baseline process did not match the benchmark, and the rapid cooling experiments produced results which were less favourable than the baseline process, the experiment demonstrates that rapid cooling can produce results comparable to the benchmark and baseline processes and after correction of some problems with the tool and with some optimisation it is likely that the benchmark results can be exceeded.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The invention claimed is:

1. A method for hydrogenation over a large planar area target using a hydrogen source comprising at least one discrete localised intense atomic hydrogen source, the method comprising:
   a) raising the temperature of a target to a temperature within a predetermined processing temperature range;
   b) moving the target through one or more fields of atomic hydrogen whereby only a portion of the area of the target is in any one atomic hydrogen field at any time and continuing the movement of the target until at least one area of the target has been subjected to an atomic hydrogen field for a predetermined minimum period of time;

c) cooling the target after the at least one area of the target has been subjected to an atomic hydrogen field for a predetermined minimum period of time at temperatures within the predetermined processing temperature range; and d) intermittently exposing the target to an atomic hydrogen field during cooling of the target; and e) terminating exposure of the target to the atomic hydrogen field when the target reaches a predetermined lower temperature limit.

2. The method of claim 1 wherein the source comprises a plurality of discrete localised intense atomic hydrogen sources, each source of the plurality of sources providing a field of atomic hydrogen establishing a respective processing area which is smaller than the target, the method further comprising moving the target through one or more of the plurality of fields of atomic hydrogen, whereby only a portion of the area of the target is in any one atomic hydrogen field at any time, and continuing the movement of the target until all of the area of the target has been subjected to an atomic hydrogen field for a predetermined minimum period of time.

3. The method of claim 1 wherein a vacuum processing chamber is provided which contains a heating zone, a high temperature processing zone and a cooling zone, at least one hydrogen source being located in the high temperature processing zone.

4. The method of claim 3, wherein the temperature of the target is raised to a temperature within the predetermined processing temperature range in the heating zone prior to moving the target into the high temperature processing zone.

5. The method of claim 3, wherein after the moving of the target through the one or more fields of the atomic hydrogen in the high temperature processing zone, the target is passed from the high temperature processing zone to the cooling zone.

6. The method of claim 5, wherein one or more atomic hydrogen sources are provided in the cooling zone to generate the atomic hydrogen fields to which the target is subjected during cooling.

7. The method as claimed in claim 3, wherein the target to be hydrogenated is a thin polycrystalline silicon film formed on a glass substrate.

8. The method as claimed in claim 1 wherein the target to be hydrogenated is a thin polycrystalline silicon film formed on a glass substrate.

9. A method for hydrogenation over a large planar area target using a hydrogen source comprising at least one discrete localised intense atomic hydrogen source, the method comprising:

a) raising the temperature of a target to a temperature within a predetermined processing temperature range;

b) moving the heated target through one or more fields of atomic hydrogen whereby only a portion of the area of the target is in any one atomic hydrogen field at any time and continuing the movement of the target until at least one area of the target has been subjected to an atomic hydrogen field for a predetermined minimum period of time;

c) after the at least one area of the target has been subjected to an atomic hydrogen field for a predetermined minimum period of time at temperatures within the predetermined processing temperature range, rapidly cooling the target while still moving the target through the one or more atomic hydrogen fields; and d) terminating exposure of the target to the atomic hydrogen fields when the target reaches a predetermined lower temperature limit.

* * * * *